United States Patent
Fu et al.

(10) Patent No.: US 8,927,352 B2
(45) Date of Patent: Jan. 6, 2015

(54) CHANNEL EPITAXIAL REGROWTH FLOW (CRF)

(71) Applicant: Taiwan Semiconductor Manufacturing Company, Ltd., Hsin-Chu (TW)

(72) Inventors: Ching-Feng Fu, Taichung (TW); Shih-Ting Hung, Sanchong (TW); Hsin-Chih Chen, Tucheng (TW); Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/791,040

(22) Filed: Mar. 8, 2013

(65) Prior Publication Data
US 2014/0252488 A1 Sep. 11, 2014

(51) Int. Cl.
*H01L 21/84* (2006.01)
*H01L 29/66* (2006.01)
*H01L 29/78* (2006.01)

(52) U.S. Cl.
CPC ........ *H01L 29/66795* (2013.01); *H01L 29/785* (2013.01)

USPC .......................................... 438/157; 438/424

(58) Field of Classification Search
CPC ................................................. H01L 21/26513
USPC .................................................. 438/424, 157
See application file for complete search history.

(56) References Cited

U.S. PATENT DOCUMENTS

| 6,855,596 B2 * | 2/2005 | Fichtl et al. | 438/243 |
| 2005/0035391 A1 * | 2/2005 | Lee et al. | 257/308 |

* cited by examiner

*Primary Examiner* — Matthew Reames
(74) *Attorney, Agent, or Firm* — Slater & Matsil, L.L.P.

(57) ABSTRACT

A Fin-FET fabrication approach and structure are provided using channel epitaxial regrowth flow (CRF). The method includes forming a Fin-FET structure including a Si line on a substrate, shallow trench isolation (STI) oxide on both sides of the Si line on the substrate, and a poly wall on top of and across the STI oxide and the Si line, wherein the Si line is higher than the STI oxide from the substrate. The method further includes thinning the STI oxide and the Si line while maintaining about the same height ratio of the Si line and the STI oxide, and forming a spacer wall adjacent to both sides of the poly wall and further adjacent to Si and STI oxide side walls under the poly wall uncovered due thinning the STI oxide and the Si line.

20 Claims, 12 Drawing Sheets

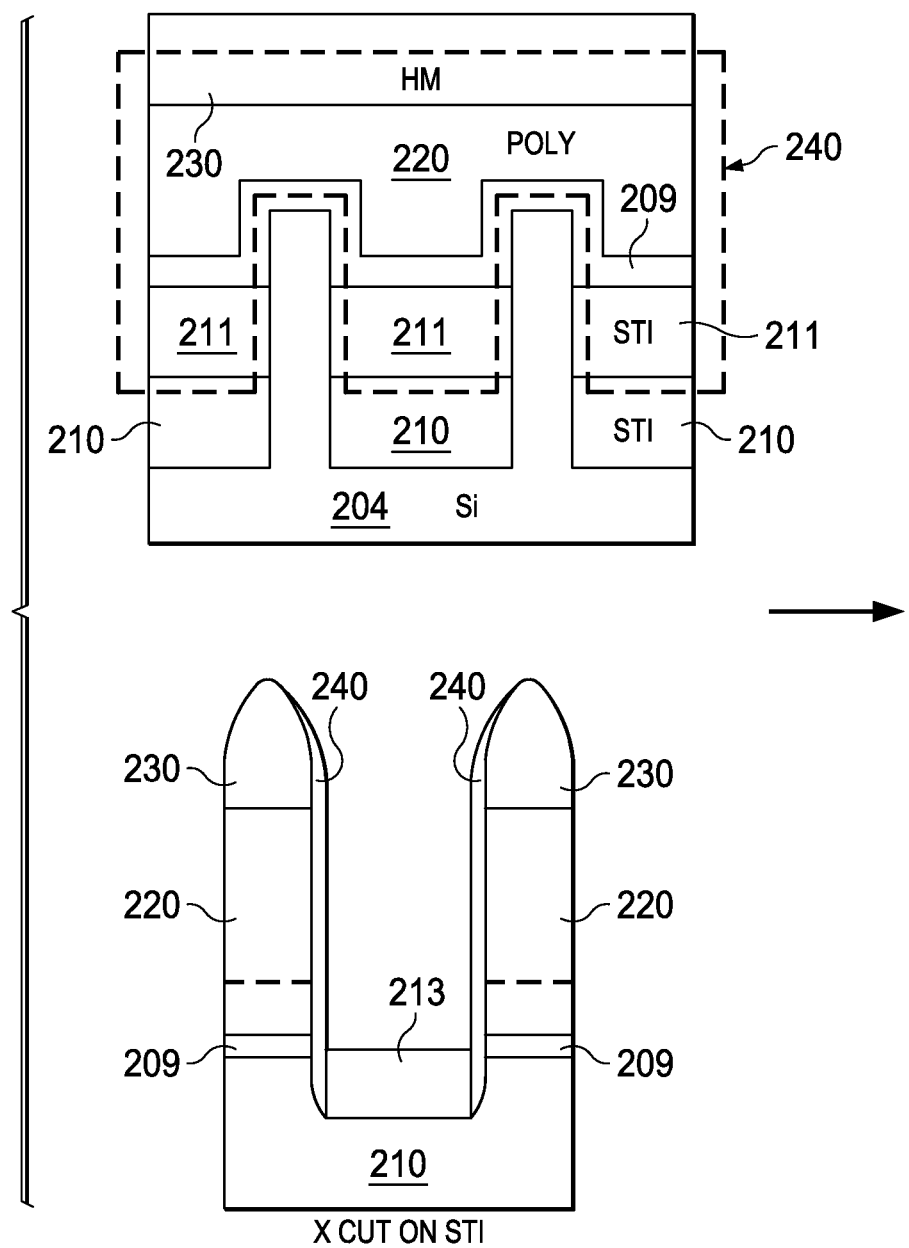

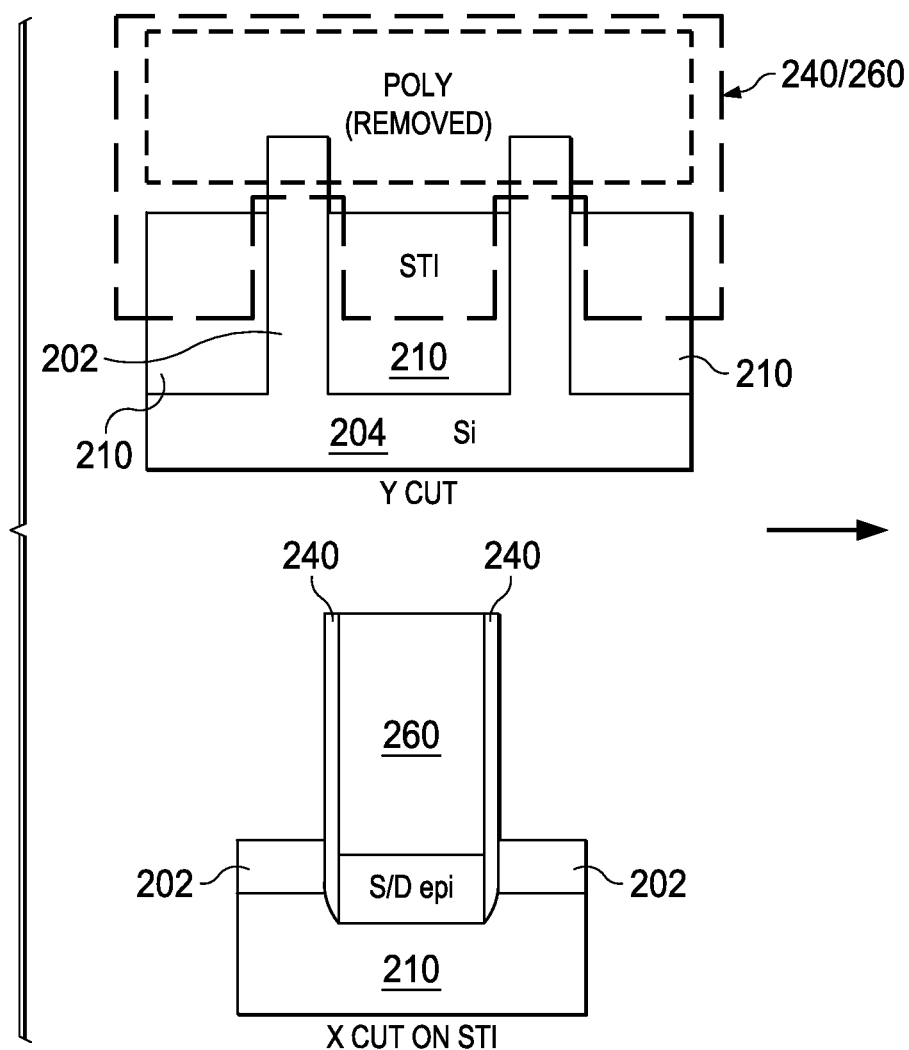

CHANNEL EPITAXIAL REGROWTH FLOW (CRF)

TECHNICAL FIELD

The present invention relates generally to a system and method for semiconductor chip fabrication, and, in particular embodiments, to a patterning approach for channel epitaxial regrowth flow (CRF).

BACKGROUND

Epitaxy refers to the deposition of a crystalline overlayer on a crystalline substrate, where there is one or more preferred orientations of the overlayer with respect to the substrate. The overlayer is called an epitaxial film or epitaxial layer. The term shallow trench isolation (STI) is another integrated circuit feature which prevents electrical current leakage between adjacent semiconductor device components. STI, generally used on CMOS process technology nodes of 250 nanometers and smaller, is created early during the semiconductor device fabrication process, e.g., before transistors are formed. The key steps of the STI process involve etching a pattern of trenches in silicon (Si), depositing one or more dielectric materials (such as silicon dioxide) to fill the trenches, and removing the excess dielectric.

A Fin-FET is a nonplanar or three-dimensional, multiple-gate transistor structure built on a Si or other substrate. The distinguishing characteristic of the Fin-FET is that the conducting channel is formed within a Si fin, which forms the body of the device. The length of the fin (measured in the direction from source to drain) determines the effective conductive channel length of the device. The conductive channel is the "stream" through which electrons flow from source to drain on the device. The fin structure can be formed by STI thin down or growing Si epi (epitaxial layer), e.g., in STI trenches.

BRIEF DESCRIPTION OF THE DRAWINGS

For a more complete understanding of the present invention, and the advantages thereof, reference is now made to the following descriptions taken in conjunction with the accompanying drawing, in which:

FIGS. 3A to 3C are side views of additional embodiment fabrication steps of a Fin-FET structure; and FIGS. 4A to 4D are side views of additional embodiment fabrication steps of a Fin-FET structure.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
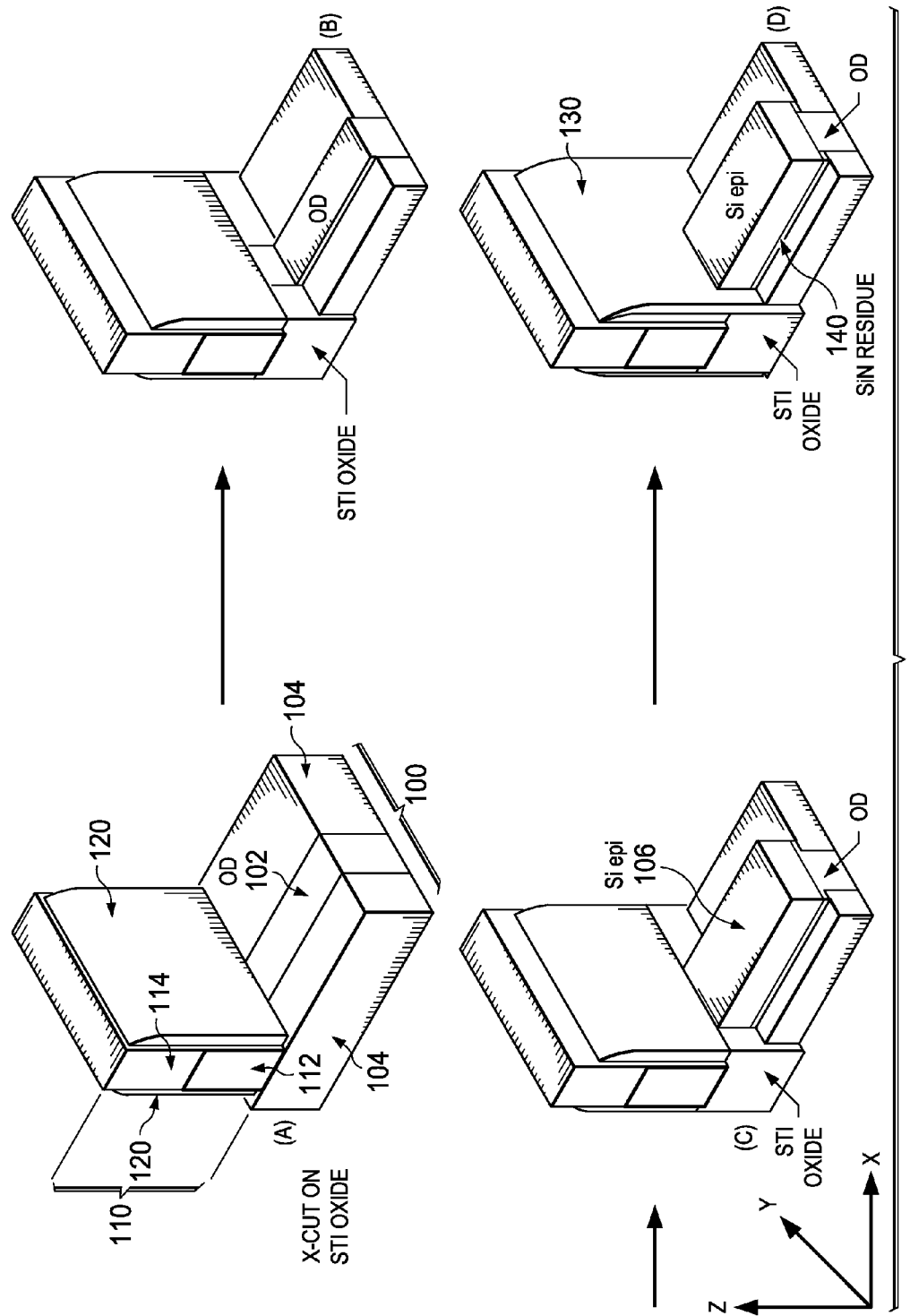
FIGS. 1A to 1D are two-dimensional and three-dimensional views of a channel epi regrowth flow (CRF) for a Fin-FET structure.

A Fin-FET structure can be formed using channel epi regrowth flow (CRF). FIGS. 1A to 1D are projected three-dimensional views that illustrate conventional fabrication steps for channel silicon (Si) epi regrowth for a Fin-FET structure. FIG. 1A shows a first step starting with a planar structure 100. The planar structure 100 includes a Si line 102 formed in the x direction and a STI oxide (Ox) 104 on both sides of the Si line 102. The Si line 102 and the STI Ox 104 are formed on a substrate (not shown), for example a Si substrate. A poly wall structure 110 is formed on top of the planar structure 100 across the Si line 102 and the STI Ox 104, e.g., in the y direction. The poly wall structure 110 includes Polysilicon (poly) 112 and a hard mask 114 (e.g., a dielectric) on top of the poly Si 112. The poly wall structure 110 serves as a dummy gate that is used to form the gate of the Fin-FET structure and is aligned in a direction perpendicular to that of the fin. A seal or spacer 120, e.g., Silicon Nitride (SiN) or a dielectric, is formed on both sides of the poly wall structure 110 to prevent epi (epitaxial) loss on the poly side walls.

FIG. 1B shows a second step of using Ox recess. The Ox recess process is used to thin down the STI Ox 104, e.g., via etching. As a result, the height of the Si line 102 is also reduced but at a slower rate resulting in variation of height between the STI Ox 104 and the Si line 102. As shown in FIG. 1B, the Si line 102 becomes higher than the STI Ox 104 as a result of the Ox recess step.

FIG. 1C shows a next step of forming a fin of the Fin-FET structure. The fin is formed by forming Si epi 106, e.g. via epitaxial growth) on top of the Si line 102. FIG. 1D shows a subsequent step of adding a second spacer 130 to prevent source-drain (S/D) epi loss. In this step a second seal or spacer 130 (e.g., SiN wall) is formed on both sides of the wall structure 110 on top of the spacer 120 to cover the exposed vertical side walls of STI Ox under the spacer 120. This step can also result in a residue 140 (e.g., SiN) formed on any exposed or uncovered side walls of the Si line 102 under the Si epi 106. The structures in the four steps above can be formed using any suitable combination of semiconductor fabrication processes, e.g., including deposition, etching, exposure, etc.

Some of the issues of the conventional CRF above include addressing Si loss due to the Ox recess step. The Ox recess process requires adding the pillar Si epi 106 on the Si line 102, which in turn requires adding a second seal or spacer (to prevent S/D epi loss). This adds more steps to the fabrication process including etching the spacer. Further, using this conventional CRF that starts with the planar structure 100 makes it difficult to form a Fin-FET structure with straight or erect STI side walls. For example, using a dry tool such as LAM or HITACHI to perform the Ox recess, the Si loss is significant and the best oxide side wall angle of the STI Ox wall exposed after etching under the poly may be around 86 degrees (tapered side wall). Using the dry tool to perform the Ox recess also requires an additional pillar Si epi to counteract the Si loss (as shown above). Forming the pillar Si epi can be difficult requiring a suitable tuning and process control.

Embodiments of a Fin-FET fabrication approach and structure are provided using CRF without adding a pillar Si epi after the Ox recess step. Thus, the issues above associated with such step are avoided. The CRF steps herein start with a three-dimensional Fin-FET structure instead of a planar structure (e.g., instead of the planar structure 100). The Fin-FET structure includes a Si line for the fin structure. This removes the need for a adding to spacers during the CRF steps and can facilitate/improve fabrication. For instance, in the Fin-FET structure, the etch rate of the oxide and the Si becomes about the same, resulting in simultaneous recess of the STI oxide and Si. Thus, a reliable and well-formed Fin-FET structure can be achieved. The steps also include using a Tokyo Electron Limited (TEL) Radial Line Slot Antenna (RLSA) tool for the Ox recess process, which creates a better straight or erect STI side wall, e.g., with a wall angle at about 88 degrees or more if the process is tuned properly.

Figure 2A:
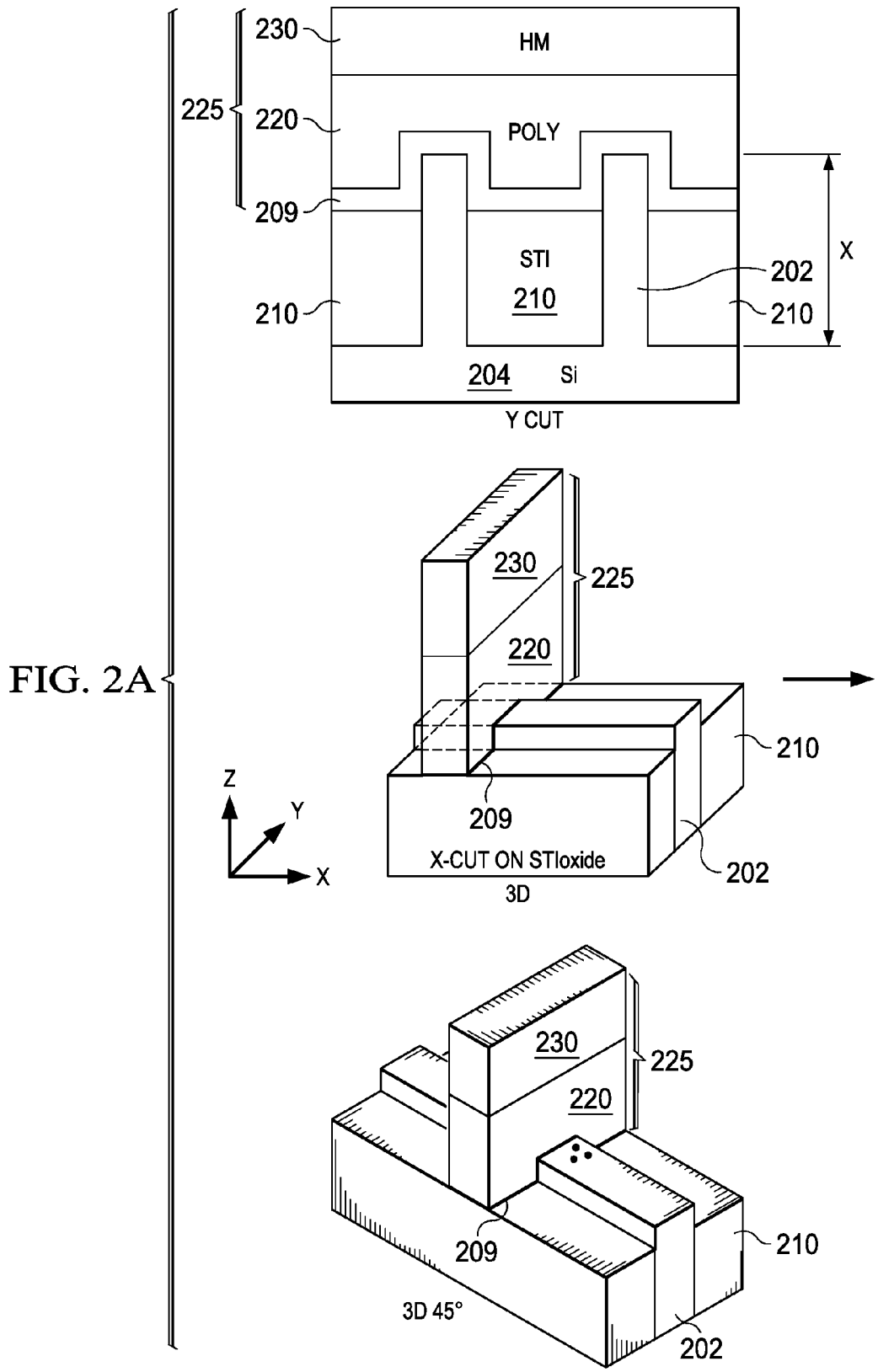
FIGS. 2A to 2C are two-dimensional and three-dimensional views of embodiment fabrication steps of a Fin-FET structure.
Figure 2B:
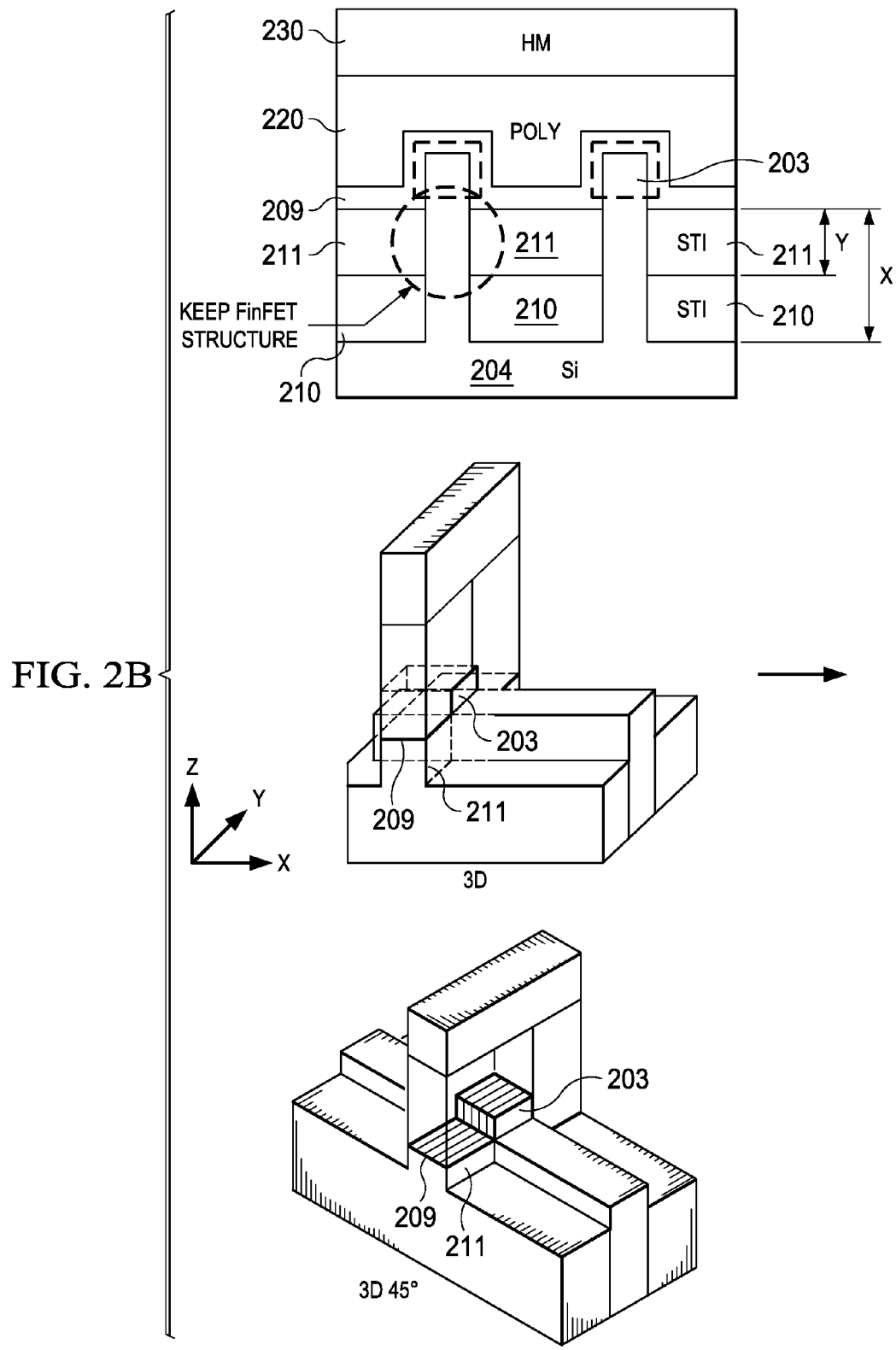
Figure 2C:
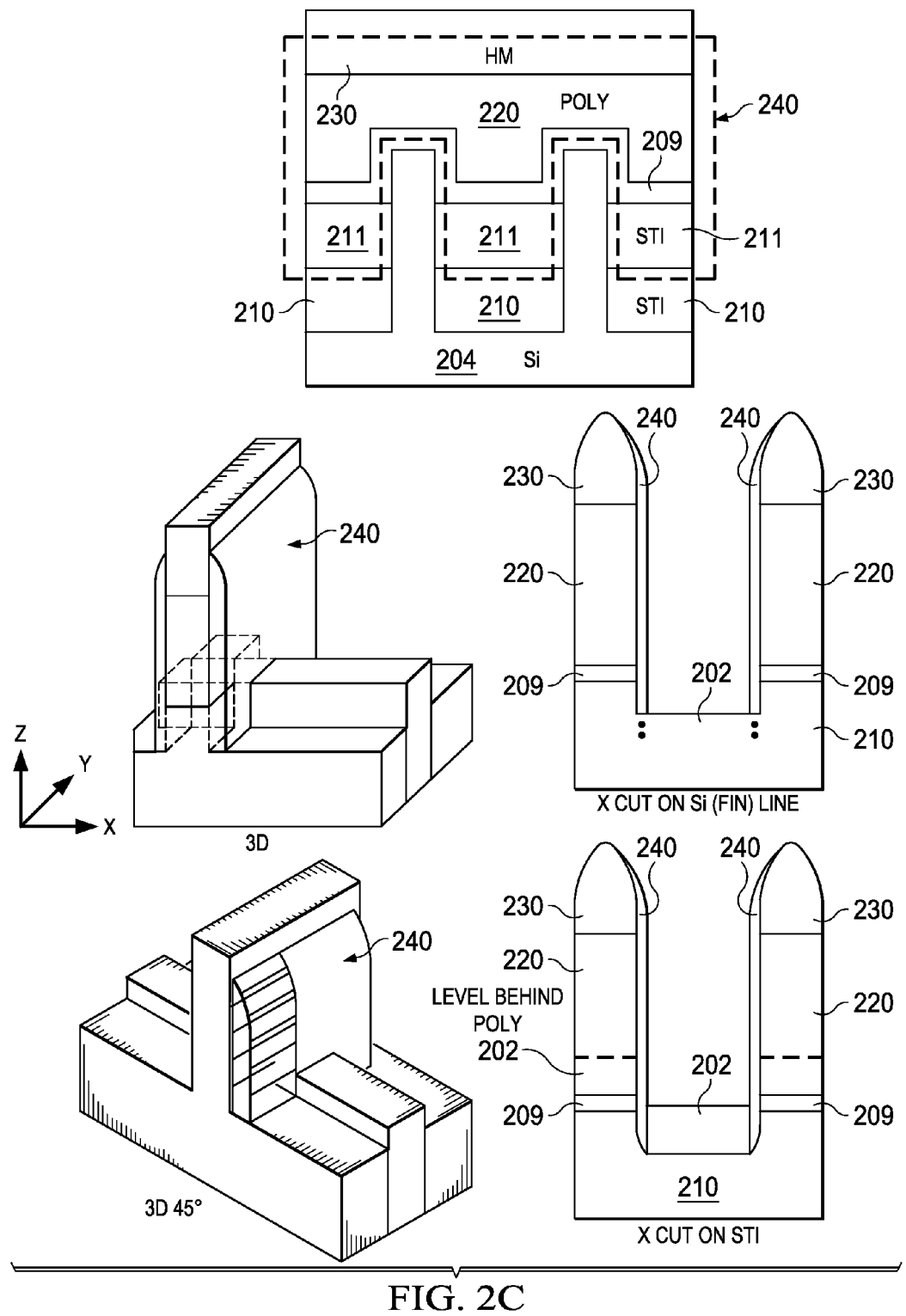
Figure 5A:
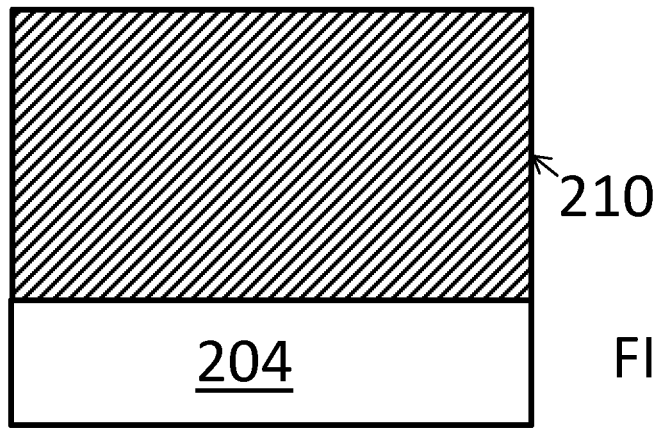
FIGS. 5A to 5C illustrate placing a layer of silicon oxide on a substrate, forming trenches therein, and growing silicon films in the trenches.
Figure 5B:
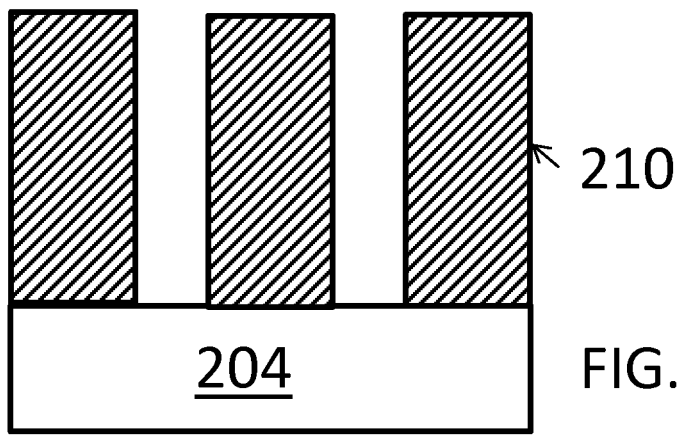
Figure 5C:
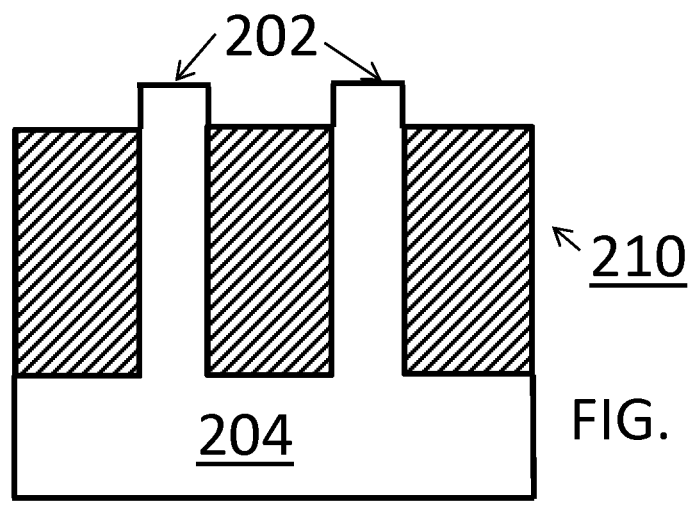

FIGS. 2A to 2C are two-dimensional and projected three-dimensional views (at different angles) that illustrate the embodiment fabrication steps for channel Si/SiGe epi regrowth for a Fin-FET structure. FIG. 2A includes 3 different views (at different orientations) of a first step starting with a Fin-FET structure (instead of a planar structure). The Fin-FET structure is a three-dimensional structure that is formed using any suitable combination of semiconductor fabrication processes, e.g., including deposition, etching, exposure, etc. The Fin-FET structure includes Si lines 202 formed on a Si substrate 204, e.g., via patterning and etching an initial planar Si substrate 204. The STI oxide 210 can then be added between the Si lines 202. Alternatively, STI oxide 210 is first formed (on a substrate 204) and patterned to include trenches therein. FIG. 5A illustrates such an alternative embodiment wherein STI oxide 210 is formed on substrate 204. FIG. 5B illustrates forming trenches in STI oxide 201. FIG. 5C illustrates Si lines 202 epitaxially grown within the trenches. In other embodiments, the lines 202 and substrate 204 are formed of any other suitable semiconductor material instead of Si.

The height of the STI oxide 210 (from the Si substrate 204) is less than the height of the Si lines 202, as shown in FIG. 2A. A dummy gate structure 225 including poly 220 is positioned on top of the STI oxide 210. The poly 220 covers or envelopes the top portions of the Si lines 202, as shown in FIG. 2A. The dummy gate 225 also includes a hard mask (HM) 230 positioned on top of the poly 220. An oxide layer 209 may also be formed under the poly 220 and above the STI oxide 210 and the covered portion of Si lines 202. Thus, the first step (which includes multiple fabrication processes) provides a three-dimensional Fin-FET with fin and gate structures. In an embodiment, the height of the Si lines 202 is between about 190 to 200 nm, and the height of the formed STI oxide 210 is shorter by about 20 to 40 nm. In FIG. 2A, the height of the Si line 202 is labeled X, and the height difference between Si lines 202 and STI oxide 210 is labeled Y. The resulting X/Y ratio of the Fin-FET structure is from about 4.7 to 10.

FIG. 2B includes 3 different views (at different orientations) of a second step of using Ox recess. A TEL RLSA tool is used for the Ox recess process. Using this tool on the three-dimensional Fin-FET structure results in about equal etch rate of the STI oxide 210 and the Si lines 202. The Ox recess process is performed on the surface areas, which results in a thinner HM 230. The OX recess also results in thinner Si lines 202 and STI oxide 210 that are exposed outside the dummy gate structure 225. The Ox recess process reduces the height of the Si line 202 (outside the dummy gate structure 225) to the height of the STI oxide 210 below the poly 211 (inside the dummy gate structure 225). The HM 230 protects the poly 220 from etching. Since the etch rate is about equal for the Si lines 202 and the STI oxide 210, the height difference between the Si lines 202 and the STI oxide 210 remains about the same, thus preserving the fin structure.

The RLSA Ox recess process can provide reliable straight STI and fin side walls without or reducing tapered side walls. The process results in exposing a Si vertical side wall 203 and a STI oxide vertical side wall 211, as shown in FIG. 2B. In an embodiment, the OX recess process using RLSA reduces the height of the Si lines 202 to about 140 to 160 nm (e.g., from 190 to 200 nm). The height reduction in the STI oxide 210 is by about 20 to 40 nm. In FIG. 2B, the reduced height for Si lines 202 is labeled X, and the height difference between Si lines 202 and STI oxide 210 is labeled Y. The resulting X/Y ratio from the OX recess process is from about 3.5 to 8. This ratio is comparable to the X/Y ratio prior to the OX recess process (4.7 to 10 in FIG. 2A).

FIG. 2C includes 4 different views (at different orientations) of a subsequent step of spacer formation. In this step a seal or spacer 240, e.g., a SiN wall, is formed on both sides of the wall structure 225. The spacer 240 covers the Si vertical side wall 203, the STI vertical side wall 211, the side walls of the poly 220, and at least a portion of the side walls of the HM 230, as shown in FIG. 2C. The spacer 240 can be formed using suitable deposition and etch processes. FIG. 2C includes a two-dimensional view of the resulting structure in the y direction and two profiles in the x direction: a first profile cut across the Si (or fin) line 202 and a second profile cut across the STI oxide 210 outside the Si line 202.

The embodiment steps above for CRF do not include or need a step for adding a pillar Si epi after the Ox recess step, unlike the conventional CRF (shown in FIG. 1C). Further, the steps include forming only one seal or spacer to prevent epi loss. Another advantage of using the three-dimensional Fin-FET structure and the RLSA tool (for OX recess) is achieving more straight or erect (vertical) side walls for the fin structure, which improves device channel performance.

Figure 3B:
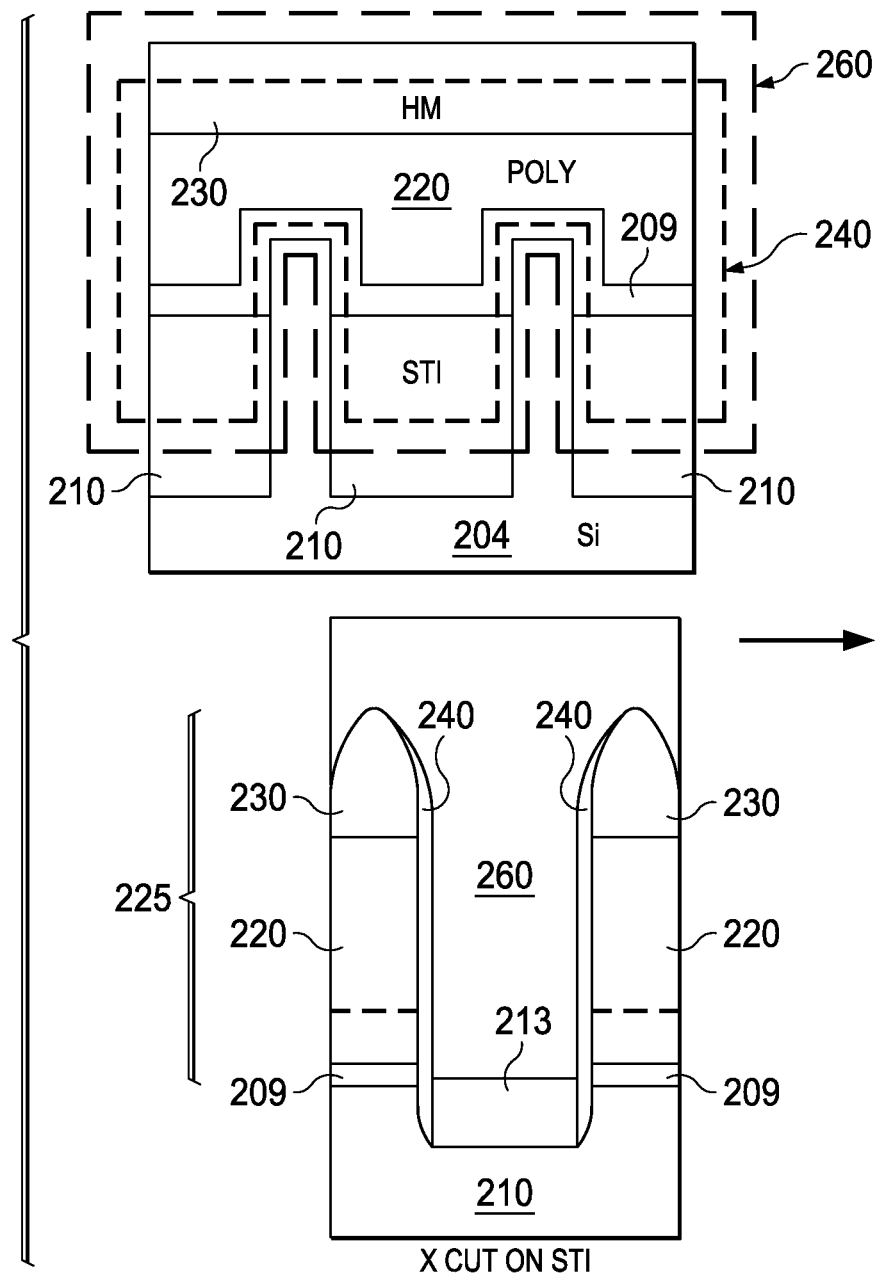
Figure 3C:
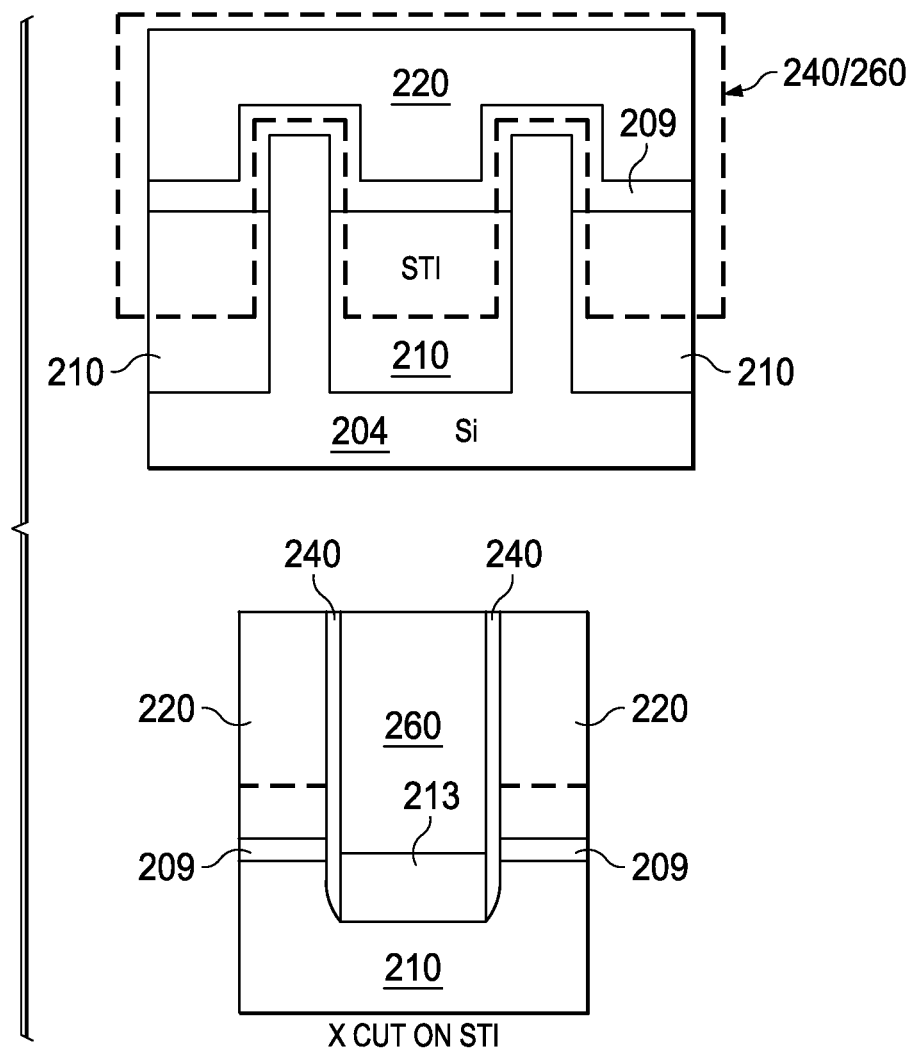

FIGS. 3A to 3C are side views that illustrate additional fabrication steps for forming the Fin-FET structure. The steps of FIGS. 3A to 3D are implemented after the steps of FIGS. 2A to 2C. FIG. 3A shows (in both y and x directions according to the coordinates of FIGS. 2A to 2C) a step of S/D epi formation, where the layers behind the spacer 240 are shown. This step can be implemented after adding the spacer formation step in FIG. 2C. In this step, a top portion of the Si line 202 between gates is removed (e.g., via etching) and replaced by S/D epi 213 that is formed on top of the remaining portion of the Si line 202 between the gates. The S/D epi 213 forms the fin between the gates and is coupled to the Si line portion enveloped by the poly 220 in the dummy gate structure 225. Thus, electrical current can flow between the S/D epi 213 outside the gate structure and the Si line inside the gate structure.

FIG. 3B shows a next step of adding an Ox filler 260 (e.g., a dielectric) in front of the spacer 240 and above the dummy gate structure 225 (above the HM 230). The Ox filler 260 is formed between gates and over the S/D epi 213. FIG. 3C shows a following step of removing the HM 230. This step also includes removing an excess top portion of the Ox filler 260, which results in about the same height of the Ox filler 260, the spacer 240, and the poly 220.

Figure 4B:
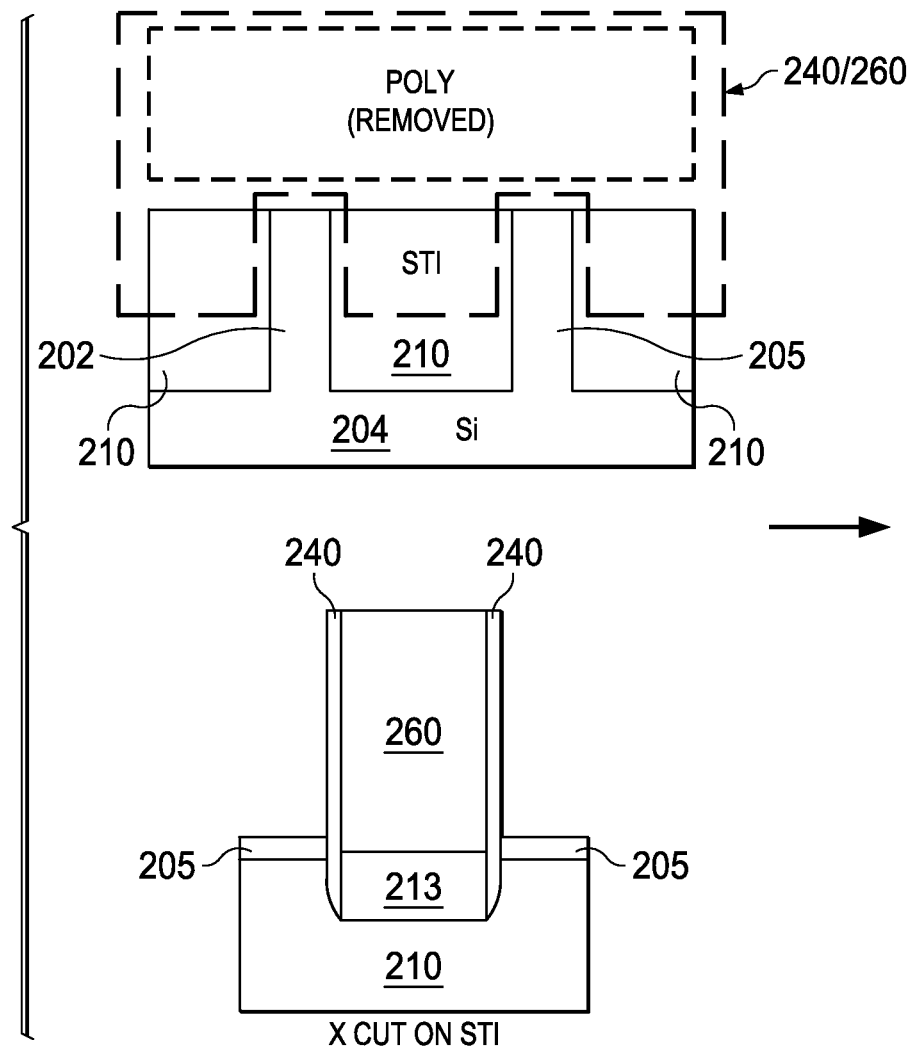

FIGS. 4A to 4D are side views that illustrate additional fabrication steps for forming the Fin-FET structure. FIG. 4A shows (in both y and x directions according to the coordinates of FIGS. 2A to 2C) a next step of poly removal. This step can be implemented after the hard mask removal step in FIG. 3C. In this step, the poly 220 behind the spacer 240 is removed. Further, the oxide layer 209 at the gate location (on top of the Si line 202 and the STI oxide 210) is removed, leaving the Si line 202 at the gate location exposed.

FIG. 4B shows a channel epi formation step. In this step, a top portion of the Si line 202 at the gate location is removed (e.g., via etching) and replaced by a channel Si/SiGe epi 205 that is formed on top of the remaining portion of the Si line 202 at the gate location. The Si/SiGe epi 205 is coupled (across the spacer 240) to the S/D epi 213 between the gates via the Si line 202 below both the Si epi 205 and the S/D epi 213. Thus, electrical current can flow between the Si/SiGe epi 205 at the gate location and the S/D epi 213 outside the gate location.

Figure 4C:
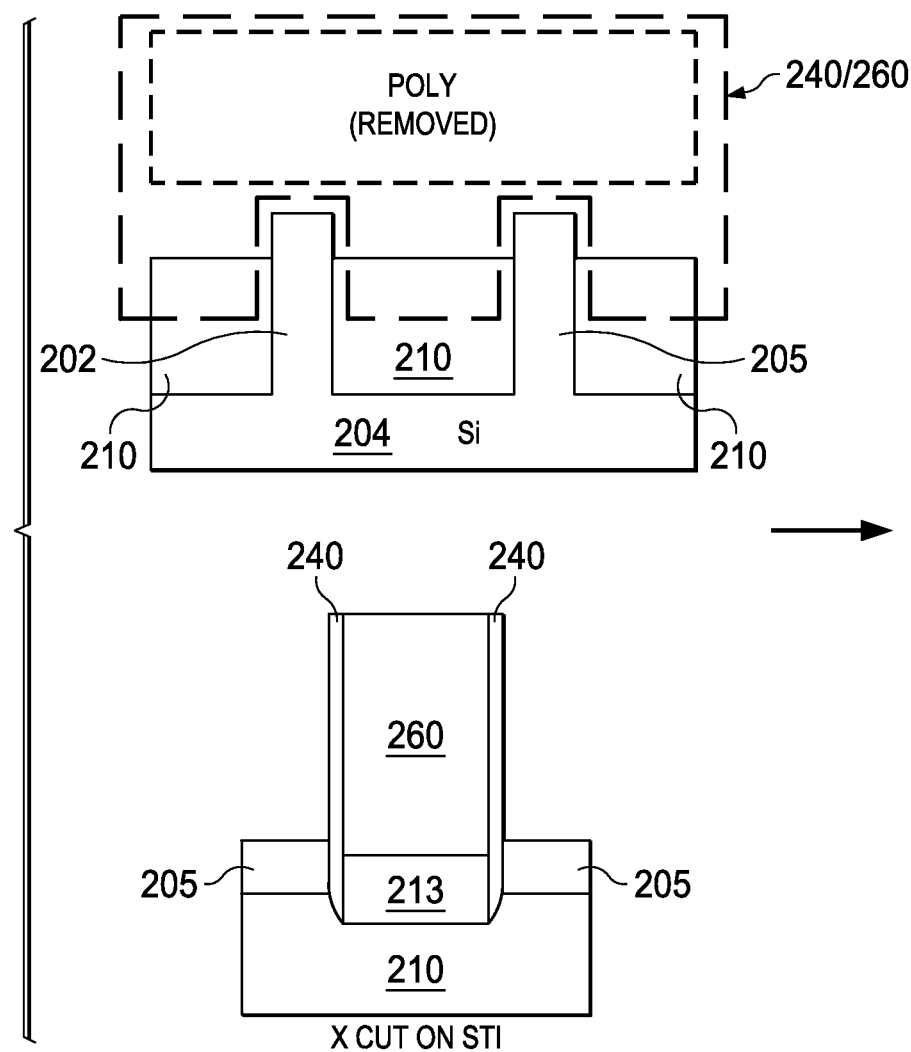
Figure 4D:
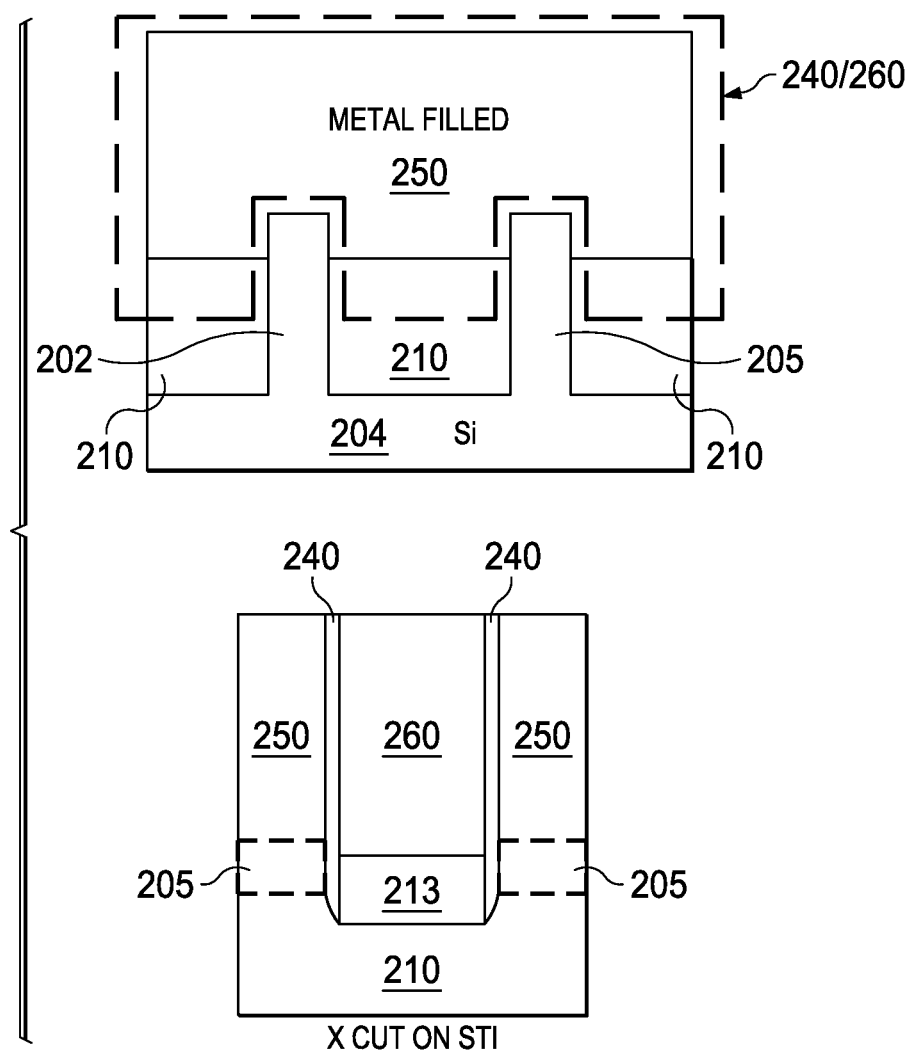

FIG. 4C shows a fin formation step. The step includes etching or removing a top portion of the STI oxide 210 to expose more of the channel Si/SiGe epi 205 at the gate location. FIG. 4D shows a subsequent step of adding a metal filler 250 on top of the channel Si/SiGe epi 205 and the STI oxide 210 at the gate location to form the gate structure (behind the spacer 240). The metal filler 250 envelopes the top portion of the Si/SiGe epi 205, as shown in FIG. 4D (in the y direction). The metal filler 250 can be added using any suitable deposition or other process.

A Fin-FET structure was formed using the steps of FIGS. 2A to 2C and cut along the fin or Si line (in the x direction according to the coordinates of FIGS. 2A to 2C) after Ox recess and spacer etch. The TEL RLSA tool was used to perform the Ox recess processing. The recipe details of the RLSA Ox recess process include a gas mixture of Argon (Ar) with a flow of 600 standard cubic centimeters per minute (sccm) and Octafluorocyclopentene ($C_5F_8$) with a flow of 10 sccm, a microwave power of 2,000 watts with a bias of 400 watts, a pressure of 50 milli-Torr (mT), a center to edge ratio of 1:4, a chuck temperature 80/80 degrees Celsius, and a Chiller temperature of 30 degrees Celsius.

The profile of the cut FinFET structure was captured via a tunneling electron microscope (TEM). The TEM pictures show a resulting etch rate ratio of STI Ox to Si at about 0.8 to 1.2. In other words, the etch rate is about the same for the two. The pictures also show a resulting STI Ox vertical side wall (at the fin line) with an angle of about 87 to 90 degrees and a height (from the substrate) of about 30 to 40 nm. Similarly, the resulting Si vertical side wall (at the fin line) has an angle of about 87 to 90 degrees and a height (from the substrate) of about 30 to 40 nm. The results show an improved Fin-FET structure using the embodiment CRF steps described above.

In accordance with a preferred embodiment of the present invention, a method for channel epitaxial regrowth flow, the method includes forming a Fin-FET structure including a Si line on a substrate, STI oxide on both sides of the Si line on the substrate, and a poly wall on top of and across the STI oxide and the Si line, wherein the Si line is higher than the STI oxide from the substrate. The method further includes thinning the STI oxide and the Si line while maintaining about the same height ratio of the Si line and the STI oxide, and forming a spacer wall adjacent to both sides of the poly wall and further adjacent to Si and STI oxide side walls uncovered under the poly wall due to thinning the STI oxide and the Si line.

In accordance with another preferred embodiment of the present invention, a method for forming a Fin-FET structure includes forming a Si line on a substrate, forming STI oxide on the substrate on both sides of the Si line, wherein the Si line is higher than that of the STI oxide from the substrate, and forming a poly wall on top of and across the STI oxide and the Si line. The method further includes etching a surface of the STI oxide and the Si line outside the poly wall at about the same rate to match a height of the Si line to a height of non-etched STI oxide under the poly wall, and forming a spacer wall on both sides of the poly wall, wherein the spacer wall covers Si and STI oxide side walls uncovered under the poly wall due to etching the STI oxide and the Si line.

In accordance with another preferred embodiment of the present invention, a Fin-FET structure includes a substrate, a Si line on the substrate, and STI oxide on the substrate on both sides of the Si line, wherein the Si line is higher than the STI oxide from the substrate. The Fin-FET structure further includes a gate structure on top of and across the STI oxide and the Si line and serving as a gate, wherein the Si line and the STI oxide include a non-etched portion under the gate structure and an etched portion in front of the gate structure, and a spacer on a side of the gate structure and on side walls of the non-etched portion of the STI oxide and the Si line under the gate structure.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for channel epitaxial regrowth flow (CRF), the method comprising:
   forming a Fin-FET structure including a Si line on a substrate, shallow trench isolation (STI) oxide on both sides of the Si line on the substrate, and a polycrystalline (poly) wall on top of and across the STI oxide and the Si line, wherein the Si line is higher than the STI oxide from the substrate;
   thinning the STI oxide and the Si line while maintaining about the same height ratio of the Si line and the STI oxide; and
   forming a spacer wall adjacent to both sides of the poly wall and further adjacent to Si and STI oxide side walls uncovered under the poly wall due to thinning the STI oxide and the Si line.

2. The method of claim 1, wherein the STI oxide and the Si line are thinned at about the same rate using a Radial Line Slot Antenna (RLSA) tool for etching.

3. The method of claim 1, wherein the Si line is thinned to match a height of the STI oxide below the poly wall.

4. The method of claim 1 further comprising adding a hard mask layer on top of the poly wall, wherein the hard mask layer is thinned with the Si line and the STI oxide at about the same rate.

5. The method of claim 4 further comprising:
   etching a top portion of the Si line outside the poly wall; and
   adding source/drain epi on top of a remaining portion of the Si line outside the poly wall.

6. The method of claim 5 further comprising:
   adding an oxide filler that covers the source/drain epi, the spacer wall, and the hard mask layer; and
   removing the hard mask layer, a top portion of the oxide filler, and a top portion of the spacer wall to obtain about equal height of the oxide filler, the spacer wall, and the poly wall.

7. The method of claim 6 further comprising:
   removing the poly wall;
   etching a top portion of the Si line under the removed poly wall;
   adding channel Si/SiGe epi on top a remaining portion of Si line; and
   etching a top portion of the STI oxide surrounding the Si line to expose more of the Si/SiGe epi.

8. The method of claim 7 further comprising adding a metal filler adjacent to the spacer wall to form a gate on top of the Si/SiGe epi and the STI oxide.

9. The method of claim 1, wherein the STI oxide and the Si line are thinned by about 20 to 40 nanometers (nm).

10. A method for forming a Fin-FET structure, the method comprising:

forming a Si line on a substrate;
forming shallow trench isolation (STI) oxide on the substrate on both sides of the Si line, wherein the Si line is higher than that of the STI oxide from the substrate;
forming a polycrystalline (poly) wall on top of and across the STI oxide and the Si line;
etching a surface of the STI oxide and the Si line outside the poly wall at about the same rate to match a height of the Si line to a height of non-etched STI oxide under the poly wall; and
forming a spacer wall on both sides of the poly wall, wherein the spacer wall covers Si and STI oxide side walls uncovered under the poly wall due to etching the STI oxide and the Si line.

11. The method of claim 10, wherein the surface of the STI oxide and the Si line is etched using a Radial Line Slot Antenna (RLSA) tool configured to provide straight side walls for the STI oxide and the Si line under the poly wall with an angle of at least 87 degrees.

12. The method of claim 11, wherein the RLSA tool is configured with a gas mixture of Argon (Ar) with a flow of 600 standard cubic centimeters per minute (sccm) and Octafluorocyclopentene ($C_5F_8$) with a flow of 10 sccm, a microwave power of 2,000 watts with a bias of 400 watts, a pressure of 50 milli-Torr (mT), a center to edge ratio of 1:4, a chuck temperature of 80/80 degrees Celsius, and a Chiller temperature of 30 degrees Celsius.

13. The method of claim 10 further comprising forming a hard mask on top of the poly wall before forming the spacer wall, wherein the spacer wall covers at least a portion of hard mask side wall.

14. The method of claim 10, wherein the Si line is formed on the substrate by patterning and etching an initial planar Si substrate, and wherein the STI oxide is subsequently added onto the substrate on both sides of the Si line.

15. A method for channel epitaxial regrowth flow (CRF), the method comprising:
    placing a layer of silicon oxide on a substrate;
    forming trenches in the layer of silicon oxide on the substrate;
    adding Si lines on the substrate within the trenches, wherein the Si lines are higher than the silicon oxide from the substrate;
    forming a polycrystalline (poly) wall on top of and across the silicon oxide and the Si lines;
    etching a surface of the silicon oxide and the Si lines outside the poly wall at about the same rate to match a height of the Si lines to a height of non-etched silicon oxide under the poly wall; and
    forming a spacer wall on both sides of the poly wall, wherein the spacer wall covers Si and silicon oxide side walls under the poly wall.

16. The method of claim 15 further comprising adding a hard mask layer on top of the poly wall, wherein the hard mask layer is etched with the Si lines and the silicon oxide at about the same rate.

17. The method of claim 16 further comprising:
    etching a top portion of the Si lines outside the poly wall; and
    adding a source/drain epitaxial layer (epi) on top of a remaining portion of the Si lines outside the poly wall.

18. The method of claim 17 further comprising:
    adding an oxide filler that covers the source/drain epi, the spacer wall, and the hard mask layer; and
    removing the hard mask layer, a top portion of the oxide filler, and a top portion of the spacer wall to obtain about equal height of the oxide filler, the spacer wall, and the poly wall.

19. The method of claim 18 further comprising:
    removing the poly wall;
    etching a top portion of the Si lines under the removed poly wall;
    adding channel Si/SiGe epi on top of a remaining portion of Si lines; and
    etching a top portion of the silicon oxide surrounding the Si lines to expose more of the Si/SiGe epi.

20. The method of claim 19 further comprising adding a metal filler adjacent to the spacer wall to form a gate on top of the Si/SiGe epi and the silicon oxide.

* * * * *